(12) United States Patent
Mikami

(10) Patent No.: US 6,812,723 B2
(45) Date of Patent: Nov. 2, 2004

(54) PROBE PIN FOR A PROBE CARD

(75) Inventor: Kazunari Mikami, Yamaguchi (JP)

(73) Assignee: NEC Electronics Corporation, Kanagawa (JP)

( * ) Notice: Subject to any disclaimer, the term of this patent is extended or adjusted under 35 U.S.C. 154(b) by 0 days.

(21) Appl. No.: 09/983,171

(22) Filed: Oct. 23, 2001

(65) Prior Publication Data
US 2002/0047721 A1 Apr. 25, 2002

(30) Foreign Application Priority Data
Oct. 24, 2000 (JP) ........................................ 2000-324031

(51) Int. Cl.⁷ .............................................. G01R 31/02
(52) U.S. Cl. ...................................................... 324/761
(58) Field of Search ................................ 324/761, 437, 324/446, 445, 751, 754, 690, 696, 724, 715, 158.1, 760; 205/224, 149

(56) References Cited

U.S. PATENT DOCUMENTS

| | | | |
|---|---|---|---|
| 4,837,622 A | | 6/1989 | Whann et al. |
| 5,134,365 A | * | 7/1992 | Okubo et al. ............. 324/158.1 |
| 5,325,052 A | | 6/1994 | Yamashita |
| 5,900,316 A | * | 5/1999 | Yu ........................... 428/411.1 |
| 6,013,169 A | * | 1/2000 | Okubo et al. ................ 205/224 |
| 6,294,922 B1 | | 9/2001 | Okubo et al. |
| 6,300,783 B1 | | 10/2001 | Okubo et al. |
| 6,307,392 B1 | | 10/2001 | Soejima et al. |
| 2002/0097060 A1 | | 7/2002 | Maekawa et al. |

FOREIGN PATENT DOCUMENTS

| | | |
|---|---|---|
| DE | 196 17 488 A1 | 11/1997 |
| EP | 0 446 067 A2 | 9/1991 |
| EP | 0 790 502 A2 | 8/1997 |
| JP | 54-23798 | 8/1979 |
| JP | 63-310977 | 12/1988 |
| JP | 1169367 A | 7/1989 |
| JP | 1-287484 | 11/1989 |
| JP | 2-12070 | 1/1990 |
| JP | 3-180769 | 8/1991 |
| JP | 5-166893 | 7/1993 |
| JP | 5-322930 | 12/1993 |
| JP | 6-66833 | 3/1994 |
| JP | 6-58372 | 8/1994 |
| JP | 6-249879 | 9/1994 |
| JP | 7248337 A | 9/1995 |
| JP | 9-236619 | 9/1997 |
| JP | 10-31034 | 2/1998 |
| JP | 11-38039 A | 2/1999 |
| JP | 11-038039 | 2/1999 |
| JP | 11-133062 | 5/1999 |
| JP | 11-148947 | 6/1999 |
| JP | 11-160355 | 6/1999 |
| JP | 11-237406 | 8/1999 |
| JP | 11-273818 | 10/1999 |
| KR | 10-0309303 | 5/1999 |
| KR | 2000-0059158 | 5/2000 |

* cited by examiner

Primary Examiner—David A. Zarneke
Assistant Examiner—Trung Q. Nguyen
(74) Attorney, Agent, or Firm—Foley & Lardner LLP

(57) ABSTRACT

A probe card includes a card plate and a plurality of probe pins fixed onto the card plate. Each of the probe pins has a metallic body made of rhenium-containing tungsten, and a nickel film and a rhodium film consecutively formed on the metallic body by a plating technique using a liquid flow of a plating liquid.

3 Claims, 6 Drawing Sheets

PROBE PIN FOR A PROBE CARD

BACKGROUND OF THE INVENTION (a) Field of the Invention

The present invention relates to a probe pin for a probe card and, more particularly, to a probe pin of a probe card for use in testing electric characteristics of a semiconductor circuit or LSI.

(b) Description of the Related Art

Semiconductor circuits fabricated as semiconductor chips on a semiconductor wafer are generally subjected to a product test for electric characteristics thereof by using a probe card and a circuit tester before separating the wafer into a plurality separate chips.

FIG. 1 shows a typical probe card for use in testing a semiconductor chip. The probe card, generally designated by numeral 10, includes a card plate 14 having therein a central aperture 12, and a large number of probe pins attached onto the outer peripheral area of the bottom surface of the card plate 14 and extending downward in a slanting direction from the peripheral area toward the central aperture 12 of the card plate 14. The tip of each probe pin 16 is located right under the central aperture 12.

The base of each probe pin 16 is in contact with the bottom of a via plug 22 penetrating the card plate 14, and is connected to a card terminal 28 through the via plug and an interconnect wire 26. The card terminal 28 is electrically connected to a circuit tester not shown. The probe pin 16 has a tip portion directed substantially in the vertical direction, and is supported in the vicinity of the tip portion by a pin support 24 made of epoxy resin and formed on the card plate 14 in the vicinity of the periphery of the central aperture 12. A semiconductor chip is generally tested by the probe card 10 while the tip of the probe pin 16 slides on a chip electrode 18 of the semiconductor chip under test in a semiconductor wafer 20.

The probe pin 16 is made of a hard metal, such as tungsten (W), rhenium-containing tungsten (ReW), beryllium copper (BeCu) etc., having a superior workability and an excellent elasticity. For manufacture of the probe pin 16, an ingot of the hard metal is subjected to extension to form a small-diameter metallic wire having a circular cross-section. ReW is most suited for the material of the probe pin 16 due to its large elasticity, superior resistance against abrasion, and superior workability or a property suitably formed into a metallic wire having a diameter of several tens of micrometers.

Although it is known that ReW is most suited for the material of the probe pin for the present, as described above, there is a disadvantage in that ReW is liable to oxidation on the surface thereof. For example, ReW left in an oxidation ambient for a single day is oxidized on the surface thereof to be coated with an oxide film having a higher electric resistance, which raises the contact resistance between the probe pin and the chip electrode.

In addition, since the chip electrode to be contacted by the probe pin is generally made of aluminum which is also liable to oxidation. The tip of the probe pin, after repeated contacts with the chip electrodes, is attached with aluminum powder, which is oxidized to coat the tip of the probe pin with an aluminum oxide film. This also raises the contact resistance.

For solving the above problem, the tip of the probe pin is ground or polished using a grinding or polishing tool each time after the probe pin is used for testing several tens or several hundreds of semiconductor chips. The grinding by tool raises the cost and time for the testing.

Patent Publication JP-A-11-38039 describes a probe pin having a metallic body coated with a non-oxidizable metallic film after shaping the metallic body. The non-oxidizable metallic film is formed on the metallic body made of tungsten by metallization to a thickness of several micrometers, followed by a heat treatment in a vacuum ambient or non-oxidizing ambient to diffuse non-oxidizable metal from the non-oxidizable metallic film to the tungsten body, thereby improving the resistance of the tungsten body against oxidation. A plurality of resultant probe pins are then attached and fixed onto a card plate, followed by grinding the tips of the probe pins to have a uniform height with respect to the bottom of the card plate.

The probe pin described in the above publication, however, has the following disadvantages:

(1) tungsten is also diffused from the tungsten body to the non-oxidizable metallic film by a metallic solid diffusion during the heat treatment, whereby the surface of the probe pin changes the state thereof;

(2) a poor adherence between the tungsten body and the non-oxidizable metallic film is likely to cause a peel-off therebetween;

(3) although the adherence may be improved by polishing the surface of the tungsten body for smoothing or by forming the metallic film to have a larger thickness, it raises the cost of the probe card; and (4) the non-oxidizable metallic film is likely to be removed by the grinding of the tips of the probe pins for a uniform height.

SUMMARY OF THE INVENTION

In view of the above problems in the conventional technique, it is an object of the present invention to provide a probe pin having a lower contact resistance with the chip electrode without polishing or grinding the tip thereof after repeated contact with the chip electrodes. The present invention also relates to a probe card having such probe pins and a method for manufacturing the probe card.

The present invention provides, in one aspect thereof, a probe pin for use in a probe card including a metallic body, a nickel plating film formed on the metallic body, and a non-oxidizable film made of at least one of platinum group metals formed on the nickel plating film.

The present invention provides, in another aspect thereof, a probe card including a card plate and a plurality of probe pins fixed onto the card plate, each of the probe pins including a metallic body, a nickel plating film formed on the metallic body, and a non-oxidizable film made of at least one of platinum group metals formed on the nickel plating film.

The present invention provides, in another aspect thereof, a method for fabricating a probe card including the steps of: forming a plurality of metallic bodies by taper-shaping and bending metallic wires; fixing the metallic bodies to a card plate, polishing tips of the metallic bodies fixed onto the card plate so that the metallic bodies have a substantially uniform height with respect to a surface of the card plate; and plating the probe bodies fixed onto the card plate to form consecutively a nickel plating film and a non-oxidizable metallic film on the metallic bodies.

In accordance with the probe pin and the probe card of the present invention and the probe card manufactured by the method of the present invention, the nickel plating film functions as a smoothing underlying layer for improving the adherence between the metallic body and the overlying non-oxidizable metallic film and as a barrier layer for preventing the metallic solid diffusion between the metal of the metallic body and the metal of the non-oxidizable metallic film. The nickel plating film has an anchor function wherein nickel in the nickel plating film enters the depressions on the surface of the metallic body, thereby having an excellent adherence with respect to the metallic body.

The smooth surface of the nickel plating film also affords a smooth surface for the non-oxidizable metallic film, thereby preventing attachment of aluminum powder onto the non-oxidizable metallic film from the chip electrode. Thus, the tip of the probe pin is substantially free from oxidation after a larger number of repeated contacts with the chip electrodes of semiconductor chips without polishing the tip of the probe pin.

The above and other objects, features and advantages of the present invention will be more apparent from the following description, referring to the accompanying drawings.

PREFERRED EMBODIMENTS OF THE INVENTION

Now, the present invention is more specifically described with reference to accompanying drawings.

Figure 2:
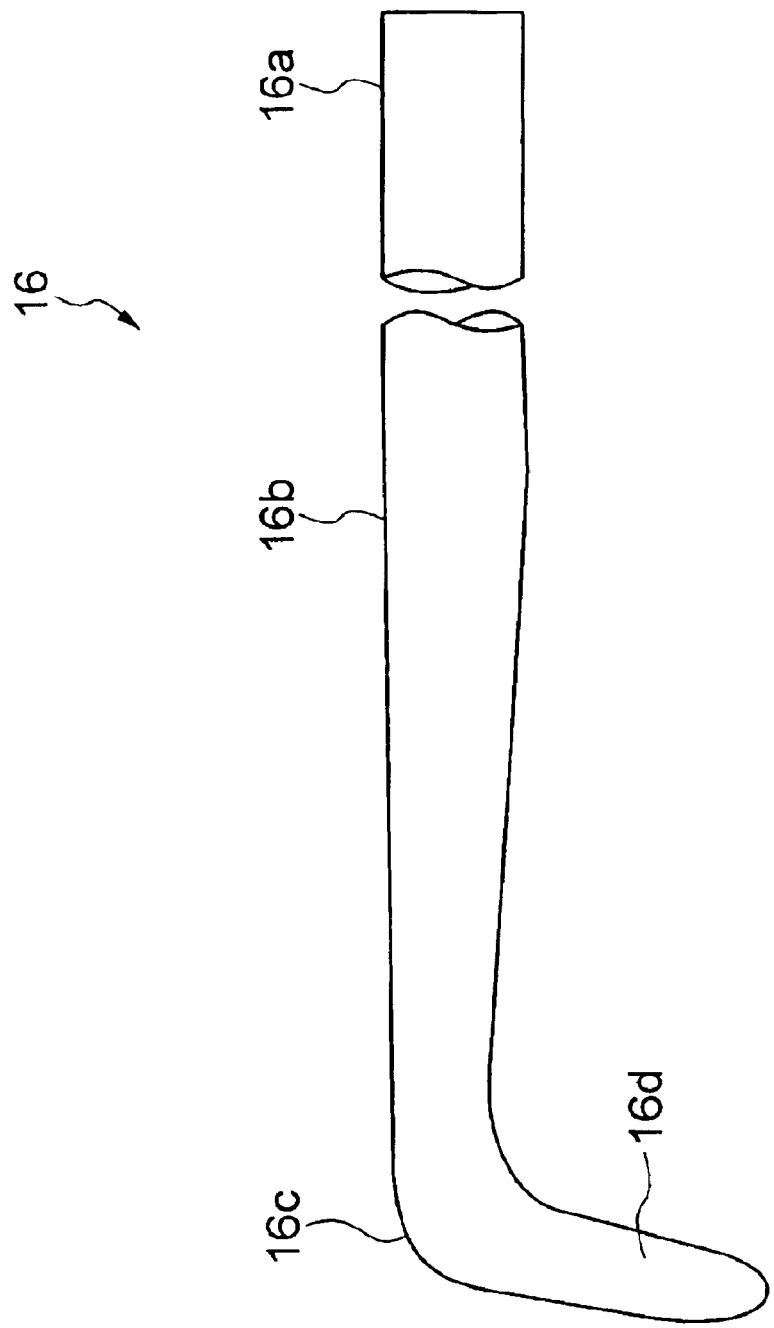
FIG. 2 is a side view of a probe pin according to an embodiment of the present invention.

Referring to FIG. 2, a probe pin according to an embodiment of the present invention has a shape similar to the conventional probe pin. More specifically, the probe pin generally designated by numeral 16 has, consecutively as viewed from the card plate (not shown), a base portion 16a having a maximum diameter, a taper portion 16b extending in a slanted direction and having a smaller diameter toward the tip, a bend 16c having an angle somewhat more than 90 degrees, and a tip portion 16d extending substantially in the vertical direction.

Figure 3:
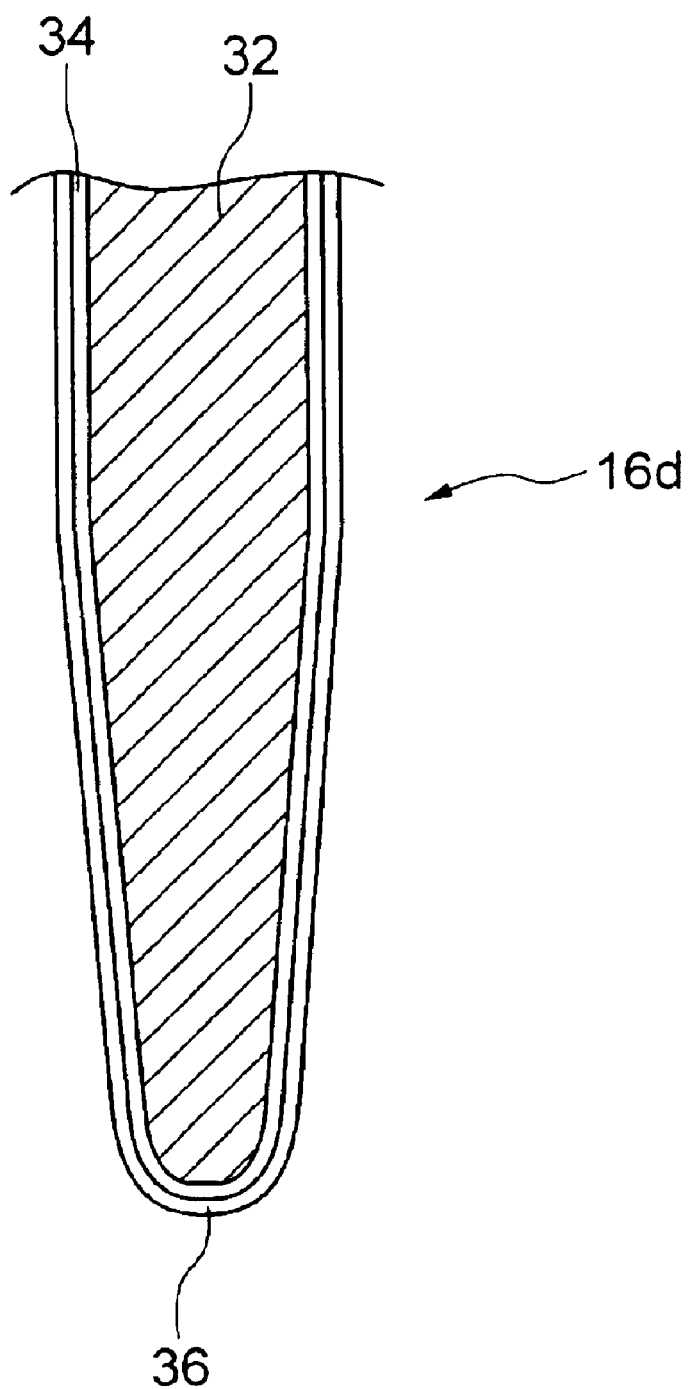
FIG. 3 is an enlarged partial sectional view of the probe pin of FIG. 2.

Referring to FIG. 3 showing the tip portion 16d of the probe pin 16, the probe pin 16 includes a metallic body or pin body 32 made of rhenium-containing tungsten, a plating film 34 made of nickel (Ni) formed on the metallic body 32 as an underlying plating film, and a non-oxidizable metallic film (overcoat) 36 made of a platinum group metal formed on the underlying plating film 34.

The metallic body 32 is formed as a rhenium-containing tungsten wire having a diameter around 0.2 mm. The metallic body 32 may be made of tungsten or beryllium copper instead. The underlying plating film 34 is formed on the metallic body 32 to a thickness of 3 micrometers by an electric-plating process.

The non-oxidizable metallic film 36 is made of rhodium having a thickness of 1 micrometer and formed by an electric-plating process. Rhodium is selected from the platinum group metals because rhodium achieves a stable contact with the chip electrodes and has a longer lifetime due to the following properties:

(1) rhodium is not oxidized below a temperature of 500° C.;
(2) rhodium has a lowest specific resistance among the platinum group metals;
(3) rhodium is less likely to be diffused into aluminum that is the main component of the chip electrodes; and
(4) rhodium has a high hardness between Hv800 and Hv1000.

Figure 1:
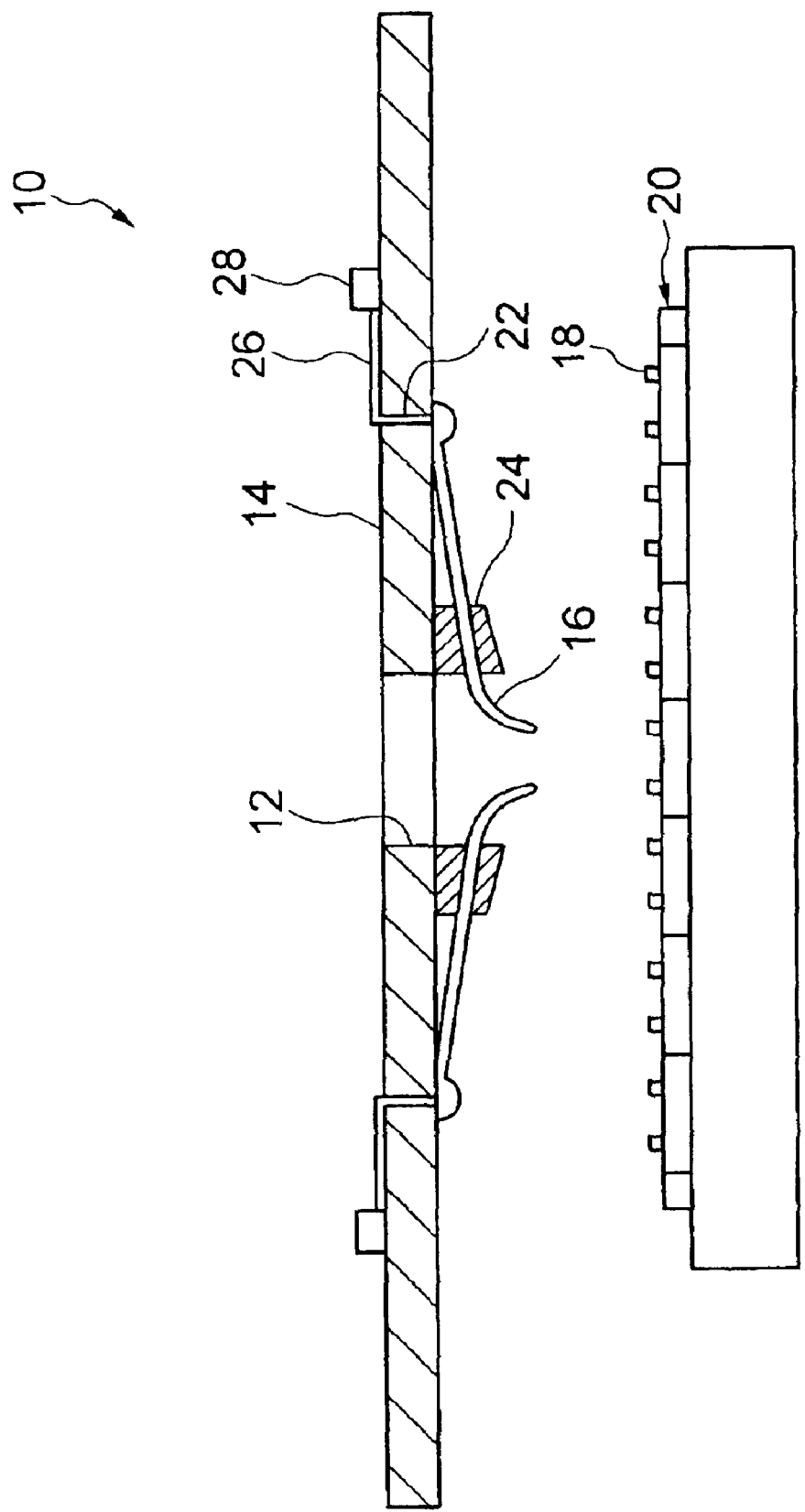
FIG. 1 is a sectional view of a typical probe card having a plurality of probe pins.

The probe pins of the present embodiment are used in the typical probe card such as shown in FIG. 1.

Samples of the probe pin of the present embodiment were attached to card bodies for measurements of the characteristics of the embodiment after repetitive contact tests. The measurements were directed to the contact resistance between the samples and chip electrodes each including aluminum added with copper. The chip electrodes were formed on micro controller units (MCUs)

Figure 4:
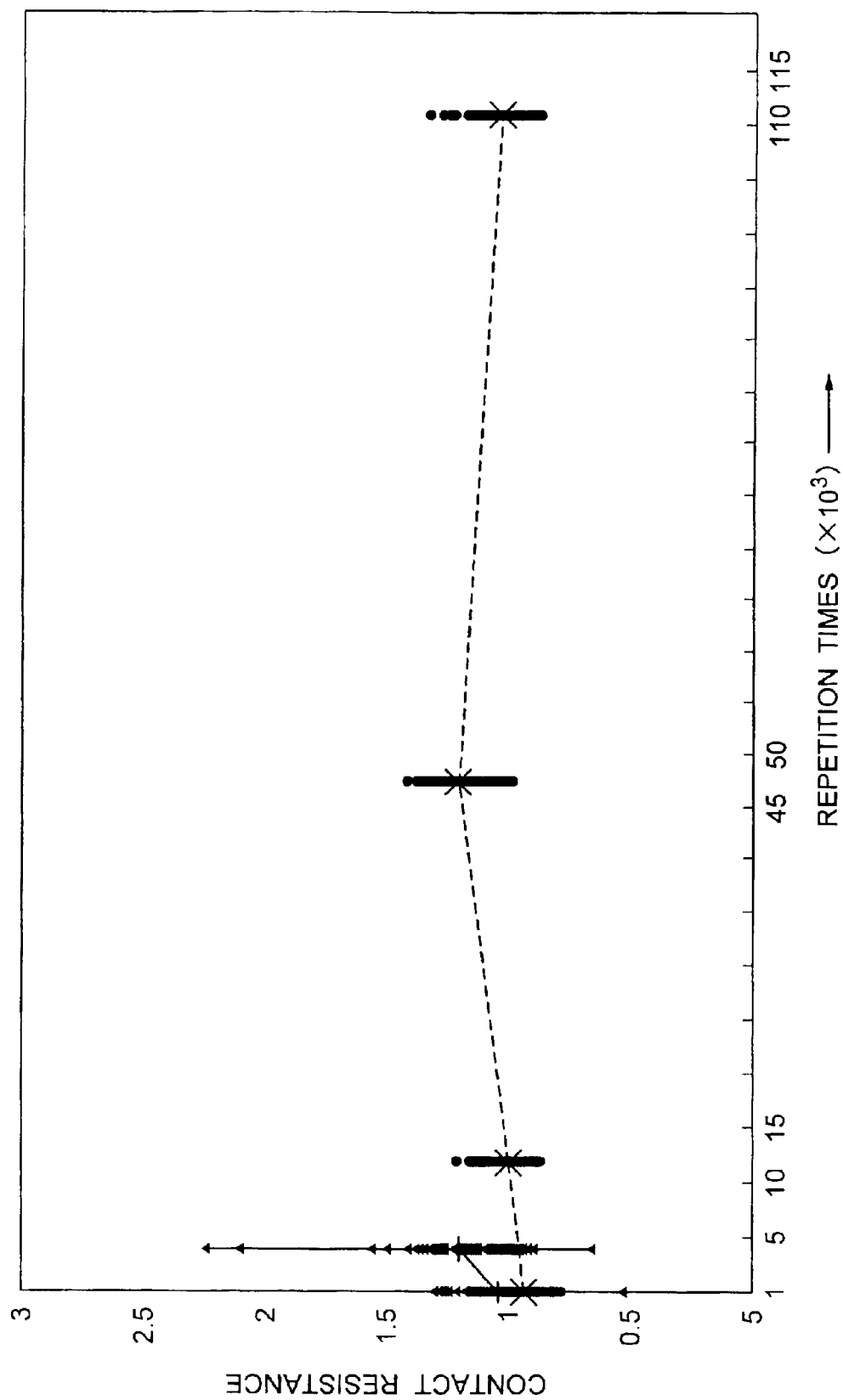
FIG. 4 is a graph showing the relationship between the contact resistance of the probe pin of the embodiment and the repetition times of the contact with the chip electrodes.

The contact resistance was measured between each sample and the chip electrode after a first contact, after about $4 \times 10^3$ times, about $12.5 \times 10^3$ times, about $47.5 \times 10^3$ times, and about $110 \times 10^3$ times of repetitive contacts therebetween. In these measurements, the probe pins were not ground for cleaning during and between the measurements. FIG. 4 shows the results of the measurements, wherein the contact resistances thus measured are shown by circular dots, and the broken line represents the mean value thereof. As shown in FIG. 4, the mean initial contact resistance was 1.0 ohm ($\Omega$).

Comparative samples of the conventional probe pin were also manufactured and subjected to similar measurements. In the measurements, the mean initial contact resistance of the comparative samples was 1.0 ohm; however, the contact resistances exceeded 2.5 ohms so that the electric characteristics of the semiconductor chips could not be measured after $5 \times 10^3$ times of repetitive contacts, and the measurements were stopped. The contact resistances measured for the comparative samples are shown by triangular dots and the mean contact resistance is shown by solid line in FIG. 4.

As understood from comparison of the contact resistances between the samples of the embodiment and the comparative samples, the probe pin according to the embodiment had a contact resistance superior to the contact resistance of the conventional probe pin. More specifically, the samples of the present embodiment exhibited superior contact resistances lower than 1.5 ohms after $110 \times 10^3$ times of repetitive contacts, or after testing 110,000 semiconductor chips, whereas the comparative examples of the conventional probe pin failed after $5 \times 10^3$ times of repetitive contacts, or after testing 5000 semiconductor chips. Thus, it was concluded that the probe pin of the embodiment had a higher resistance against oxidation over the conventional probe pin.

It is unnecessary to grind or polish the tip of the probe pin of the embodiment for reducing the contact resistance between the probe pin and the chip electrode to an allowable level after repetitive contacts. This raises the throughput for testing the semiconductor chips to thereby reduce the cost and time for testing thereof.

It is to be noted that there was no rhodium content on the chip electrodes subjected to the contact by the probe pins of the embodiment. This means that the rhodium film or non-oxidizable metallic film is not liable to abrasion and has a longer lifetime due to the underlying plating film.

Figure 5:
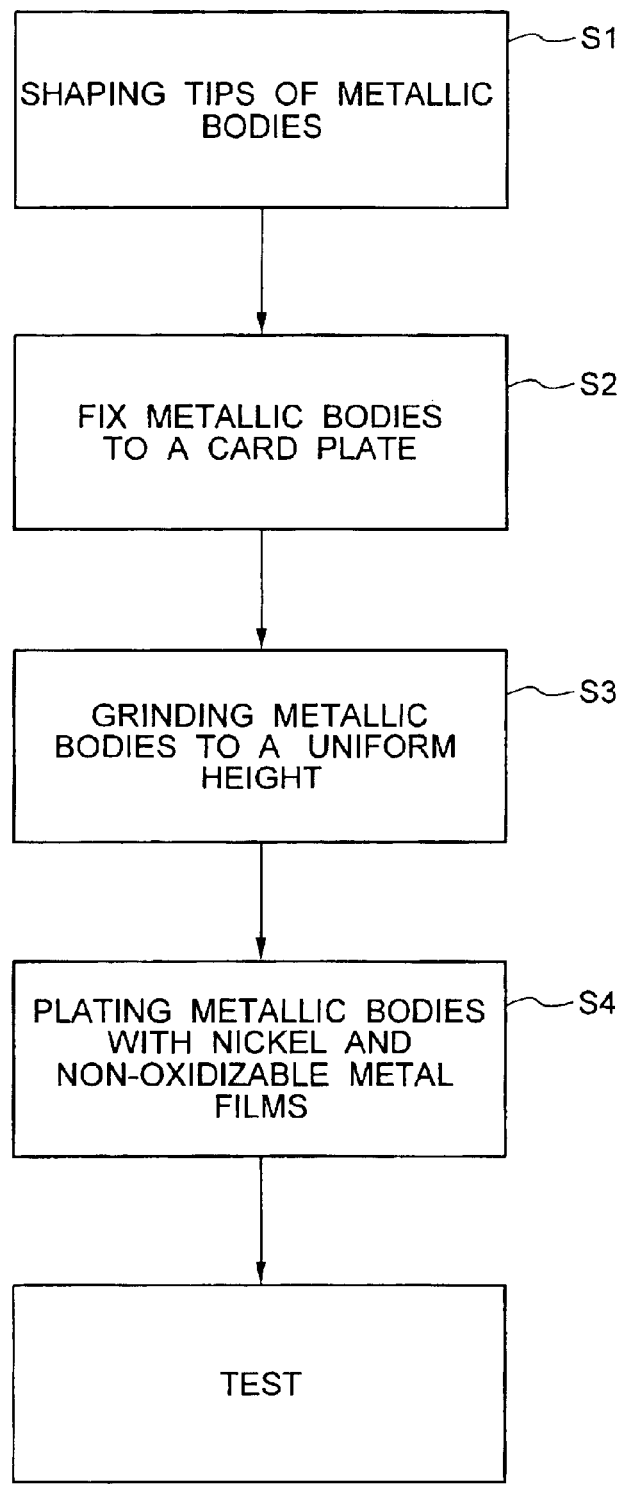
FIG. 5 is a flowchart showing the process steps of fabrication of a probe card by using the probe pins of the embodiment.

Referring, in addition to FIG. 1, FIG. 5 showing a manufacturing process for a probe card according to an embodiment of the present invention, in the first step (S1), metallic bodies of probe pins are formed by taper-shaping a metallic wire made of rhenium tungsten, bending the tapered wire in the vicinity of the tip portion, and heat treating resultant wire to control the hardness thereof and remove the residual strain therein.

Subsequently, in step S2, the resultant metallic bodies of the probe pins 16 are attached and fixed using mold resin 24 onto a card plate 14, followed by forming an interconnect wire 26 on the card plate 14 for each of the probe pins 16. Thereafter, in step S3, the tips of probe pins 16 are ground and polished to have a uniform height with respect to the bottom surface of the card plate 14.

In step S4, by using an electric plating process, each metallic body of the probe pin 16 is plated with a 3-μm-thick underlying nickel film 34 and a 1-μm-thick rhodium film 36, as shown in FIG. 3.

Figure 6:
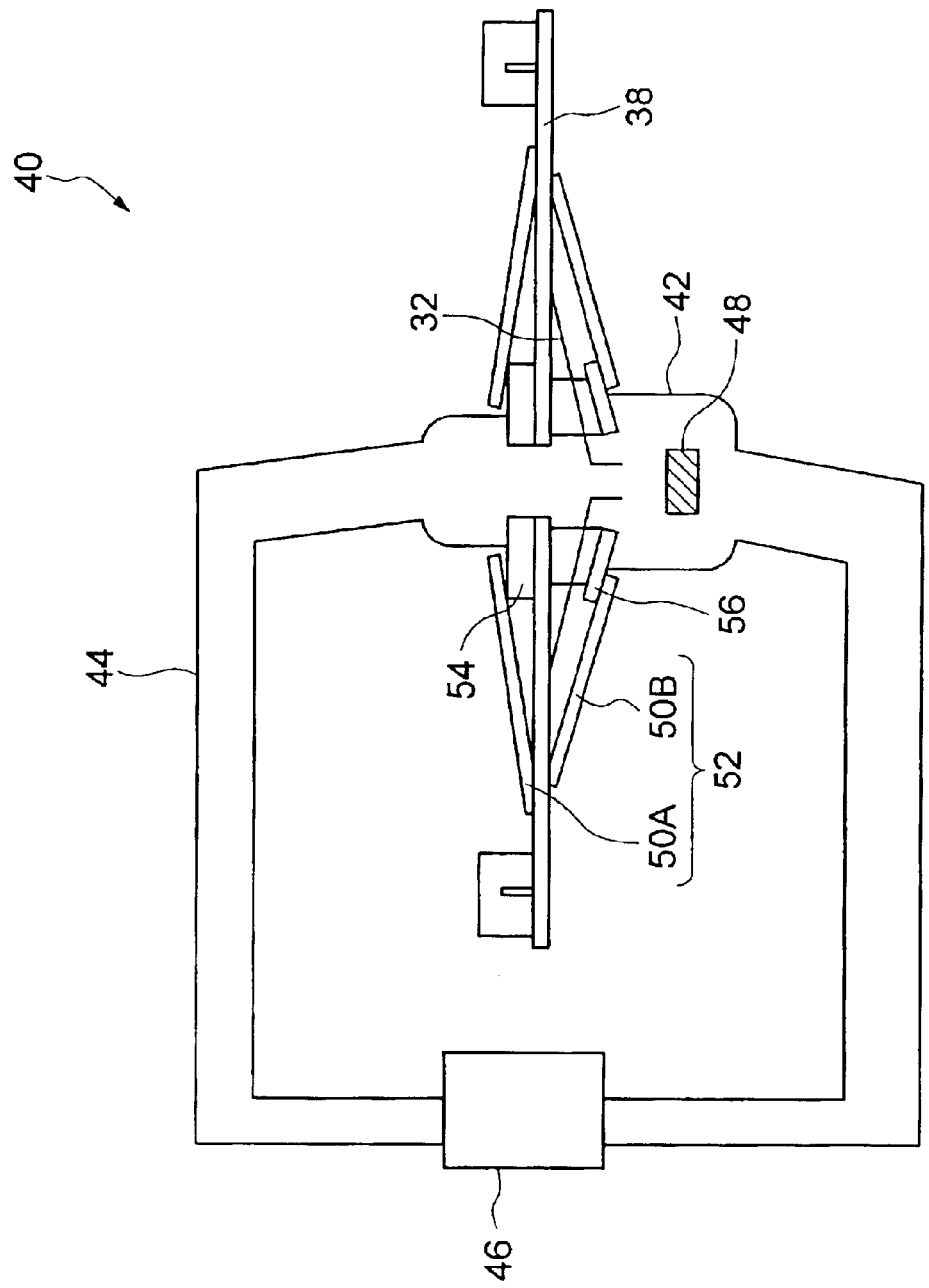
FIG. 6 is a schematic sectional view of an electric plating system used for forming the plating films on the metallic body.

Referring to FIG. 6, the electric plating system used in step S4 includes a plating bath 42 receiving therein plating liquid for plating the probe pins 32, a liquid circulating system including a tube 44 and a circular pump 46 disposed for the plating bath 42 for circulating the plating liquid therethrough, and an anode 48 opposing the probe pins 32 in the plating liquid for forming a pair of electrodes together with the probe pins constituting a cathode.

The plating bath 42 has a fixing member 52 having a pair of jigs 50A and 50B for fixing therebetween the card plate 38 for immersing most parts of the probe pins 32 including the tips thereof in the plating liquid. The fixing member 52 has a pair of gaskets 54 and 56 between the jig 50A and the card plate 38 and between the jig 50B and the card plate 38, respectively, thereby preventing the plating liquid from escaping from the plating bath 42.

The electric plating process using the electric plating system of FIG. 6 for forming the nickel film and the rhodium film includes the following steps:

(1) acid cleaning of the metallic bodies 32 using 1% to conc. hydrochloric acid, sulfuric acid or nitric acid, at a room temperature, for 2 to 15 minutes, by electrolysis with a constant voltage of 1 to 8 volts applied between the metallic bodies and the anode 48 (or immersion instead) in a circulating liquid flow;

(2) thorough water cleaning of the metallic bodies 32 at a room temperature for 20 to 120 seconds in a circulating clean water flow;

(3) alkali cleaning using 1–20% sodium hydroxide or sodium potash by immersion (or electrolysis, with a constant voltage of 1 to 8 volts) thereof at a room temperature to 50° C., for 2 to 10 minutes in a circulating liquid flow;

(4) thorough water cleaning at a room temperature for 20 to 120 seconds similarly to step (2);

(5) acid cleaning using 1% to conc. hydrochloric acid, sulfuric acid or nitric acid at a room temperature by electrolysis with a constant voltage of 1 to 8 volts (or immersion) for 2 to 15 minutes, similarly to step (1);

(6) thorough water cleaning at a room temperature for 20 to 120 seconds, similarly to step (2);

(7) alkali cleaning using 1–20% sodium hydroxide or sodium potash, at a room temperature to 50° C. for 2 to 10 minutes by immersion (or electrolysis, with a constant voltage of 1 to 8 volts), similarly to step (3);

(8) thorough water cleaning at a room temperature for 20 to 120 seconds, similarly to step (2);

(9) acid cleaning using 1% to conc. hydrochloric acid, sulfuric acid or nitric acid at a room temperature for 1 to 5 minutes by immersion, similarly to step (3);

(10) Ni-strike plating using a mixture of 50–120 ml/L hydrochloric acid solution (50–120 ml hydrochloric acid/1 litter water) and 100–300 g/L nickel chloride solution at 30°–50° C. for 20 to 120 seconds, with a constant voltage of 1 to 15 volts applied between the electrodes arranged in the vertical direction, in the reciprocal liquid flow of the vertical direction;

(11) thorough water cleaning at a room temperature for 20 to 120 seconds, similarly to step (2);

(12) Ni plating to a thickness of 1 to 5 micrometers using a mixture of 150–320 g/L nickel sulfate solution, 40–80 g/L nickel chloride solution, 15–60 g/L boric acid solution and a suitable amount of glazing agent, at 20° to 70° C. for 2 to 6 minutes, with a constant voltage of 1 to 8 volts applied between the electrodes arranged in the vertical direction in the reciprocal liquid flow of the vertical direction, wherein the steps (10) and (12) form a 3-μm-thick underlying nickel plating film 34;

(13) thorough water cleaning at a room temperature for 20 to 120 seconds, similarly to step (2);

(14) rhodium plating to a thickness of 0.2 to 2 micrometers using a mixture of 1–5 g/L rhodium solution and 40–100 ml/L sulfuric acid solution, at 20° to 60° C. for 20 to 180 seconds, with a constant voltage of 1 to 8 volts applied between the electrodes arranged in the vertical direction, in the reciprocal liquid low of the vertical direction, thereby forming, for example, a 1-μm-thick rhodium plating film 36;

(15) water cleaning for recovery of rhodium at a room temperature for 20 to 120 seconds, similarly to step (2);

(16) thorough water cleaning at a room temperature for 20 to 120 seconds, similarly to step (2);

(17) thorough water cleaning using pure water at a room temperature for 20 to 120 seconds; and

(18) alcohol cleaning using a circulating IPA solution, for example, at a room temperature for 20 to 120 seconds after removal of the card plate from the jigs, thereby removing water from the probe pins.

The rhodium may be replaced by another of platinum group metals including iridium (Ir), platinum (Pt) and ruthenium (Ru).

A preferable thickness for the nickel plating film 34 resides between 2 and 4 micrometers. A thickness for the nickel plating film 34 below 2 micrometers has a limited function as the underlying layer. On the other hand, a thickness above 4 micrometers raises the cost of the probe card, while improving little in smoothing and barrier functions.

A preferable thickness for the non-oxidizable metallic film 36 resides between 0.5 and 1.5 micrometers. A thickness for the non-oxidizable metallic film 36 below 0.5 micrometers affords a limited mechanical strength whereas a thickness above 1.5 micrometers raises the cost.

The process for forming the nickel plating film 34 and the non-oxidizable metallic film 36 may preferably use a hot dipping or electric plating technique, the latter being more preferable.

Since the above embodiments are described only for examples, the present invention is not limited to the above embodiments and various modifications or alterations can be easily made therefrom by those skilled in the art without departing from the scope of the present invention.

What is claimed is:

1. A method for fabricating a probe card comprising the steps of:

forming a plurality of metallic bodies having a circular cross-section by taper-shaping and bending metallic wires;

fixing said metallic bodies onto a card plate, and polishing tips of said metallic bodies fixed onto said card plate so that said metallic bodies have a substantially uniform height with respect to a surface of said card plate; and plating at least said polished tips of said metallic bodies fixed onto said card plate to form consecutively a nickel plating film and a non-oxidizable metallic plating film on said at least said polished tips of said metallic bodies.

2. The method as defined in claim 1, wherein said plating steps uses a liquid flow in vicinities of said polished tips of said metallic bodies.

3. The method as defined in said non-oxidizable film is a rhodium (Rh), iridium (Ir), platinum (Pt) or ruthenium (Ru) film.

* * * * *